(12) United States Patent
Kester et al.

(10) Patent No.: US 11,658,013 B1
(45) Date of Patent: May 23, 2023

(54) SYSTEM AND METHOD TO INCREASE SURFACE FRICTION ACROSS A HYDROPHOBIC, ANTI-FOULING, AND OLEOPHOBIC COATED SUBSTRATE

(71) Applicant: Quantum Innovations, Inc., Central Point, OR (US)

(72) Inventors: Norman L. Kester, Rogue River, OR (US); Peter Voin, Medford, OR (US); Danny Charles Gilkison, Gold Hill, OR (US); Philip H. Post, Talent, OR (US); John B. Glarum, Rogue River, OR (US)

(73) Assignee: Quantum Innovations, Inc., Central Point, OR (US)

( * ) Notice: Subject to any disclaimer, the term of this patent is extended or adjusted under 35 U.S.C. 154(b) by 156 days.

(21) Appl. No.: 17/461,678

(22) Filed: Aug. 30, 2021

Related U.S. Application Data

(63) Continuation-in-part of application No. 16/674,905, filed on Nov. 5, 2019, now Pat. No. 11,120,978.

(60) Provisional application No. 62/798,366, filed on Jan. 29, 2019.

(51) Int. Cl.
*H01J 37/32* (2006.01)
*G02B 1/18* (2015.01)

(52) U.S. Cl.
CPC .......... *H01J 37/32449* (2013.01); *G02B 1/18* (2015.01); *H01J 37/32715* (2013.01); *H01J 2237/20214* (2013.01)

(58) Field of Classification Search
CPC .......... H01J 37/32449; H01J 37/32715; H01J 2237/20214; G02B 1/18
See application file for complete search history.

(56) References Cited

U.S. PATENT DOCUMENTS

| | | | |
|---|---|---|---|
| 3,437,734 | A | 4/1969 | Roman et al. |
| 5,171,623 | A | 12/1992 | Yee |
| 5,902,360 | A | 5/1999 | Linzell |
| 7,531,598 | B2 | 5/2009 | Muller et al. |
| 7,985,475 | B2 | 7/2011 | Dubrow |
| 8,252,732 | B2 | 8/2012 | Al-Lamee et al. |
| 2005/0061221 | A1 | 3/2005 | Paszkowski |
| 2009/0294404 | A1* | 12/2009 | Colpo ............... C23C 26/00 216/67 |
| 2010/0330278 | A1 | 12/2010 | Choi et al. |

(Continued)

*Primary Examiner* — David E Smith
(74) *Attorney, Agent, or Firm* — Jerry Haynes Law

(57) ABSTRACT

A system and method to modify surface tension at atmosphere across a hydrophobic, anti-fouling, and oleophobic coated substrate. The substrate has a hydrophobic surface defined by a surface friction. The system modifies the surface tension, or smoothness, across the hydrophobic surface. The modification in surface tension is accomplished by generating power through an ion source to create an ion cloud. The ion cloud is generated in proximity to the substrate. The ions interact with the hydrophobic surface to create a modification of surface tension. A gas carrier device introduces an inert carrier gas through the ion cloud to increase density of the ions, which in turn increases surface friction. The system is variable, selectively increasing and decreasing surface tension by: varying the duration that the hydrophobic surface is exposed to the ion cloud; varying power applied to ion source; and varying distance between the ion cloud and the hydrophobic surface.

20 Claims, 9 Drawing Sheets

(56) References Cited

U.S. PATENT DOCUMENTS

2011/0051220 A1    3/2011   Lee
2012/0237777 A1    9/2012   Lu
2012/0315082 A1   12/2012   Linzell
2015/0262859 A1    9/2015   Balasubramanian
2018/0187310 A1*   7/2018   Hsieh ................ H01J 37/32541

* cited by examiner

SYSTEM AND METHOD TO INCREASE SURFACE FRICTION ACROSS A HYDROPHOBIC, ANTI-FOULING, AND OLEOPHOBIC COATED SUBSTRATE

CROSS-REFERENCE TO RELATED APPLICATIONS

This application is a continuation-in-part of claims the benefit of U.S. application Ser. No. 16/674,905, filed Nov. 5, 2019, and entitled SYSTEM AND METHOD TO INCREASE SURFACE FRICTION ACROSS A HYDROPHOBIC-COATED SUBSTRATE, which in turn claims the benefit of U.S. application No. 62/798,366, filed Jan. 29, 2019, and entitled SYSTEM AND METHOD TO MODIFY SURFACE TENSION ACROSS A HYDROPHOBIC-COATED SUBSTRATE, which applications are incorporated by reference herein in their entirety.

FIELD OF THE INVENTION

The present invention relates generally to a system and method to modify surface tension at atmosphere across a hydrophobic, anti-fouling, and oleophobic coated substrate. More so, the present invention relates to a system and method that modifies surface tension, or smoothness, across a hydrophobic-coated substrate by combining the effects of an ion cloud and an inert carrier gas that increases the ion cloud density; and further regulates the modification of surface tension by varying the duration that the hydrophobic-coated surface is exposed to the ion cloud, varying the power applied to the ion source, and varying the distance between the ion cloud and the hydrophobic-coated surface.

BACKGROUND OF THE INVENTION

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

Typically, it is desirable to improve performance, i.e., lifetime, abrasion wear resistance, and other durability properties of substrates, such as lenses. Because of the ease of scratching plastic and glass, it can be desirable to apply abrasion-resistant coatings onto the surface of such substrates. These hard-outer coatings increase the useful life of the substrates.

Those skilled in the art will recognize that a hydrophobic surface is generally slick, and not efficient for managing and controlling during manufacturing processes. In one type of hydrophobic substrate, a contact lens is made up of a core or bulk material that is highly oxygen permeable and hydrophobic. Often, the surface that has been treated or coated to increase hydrophilic properties, thereby allowing the lens to freely move on the eye without adhering excessive amounts of tear lipid and protein.

Other proposals have involved enhancing and increasing friction on hydrophobic surfaces of substrates. The problem with these methods is that they are not effective without dense ion clouds. Even though the above cited surface enhancing methods meet some of the needs of the market, a system and method to modify surface tension across a hydrophobic, anti-fouling, and oleophobic coated substrate by immersing the hydrophobic surface in an ion cloud that can be varied in ion density, is still desired.

SUMMARY

Illustrative embodiments of the disclosure are generally directed to a system and method to modify surface tension at atmosphere across a hydrophobic, anti-fouling, and oleophobic coated substrate. The system and method are configured to modify the surface tension, or smoothness, across the hydrophobic surface of the substrate (whether coated or not) by immersing the substrate surface in a dense ion cloud. The density of ions in the cloud, and other parameters can be adjusted to achieve a desired tension across the substrate surface. The change in surface tension is accomplished by generating electrical power through an ion source, so that the ions are charged to form an ion cloud. The ion cloud is generated at a predetermined distance from the substrate surface. The ions interact with the hydrophobic-coated surface to create a smoothing effect.

Further, the system and method introduce an inert carrier gas to the ion cloud via a gas carrier device. The introduction of inert gas works to increase the density of the ions, which in turn modifies the surface tension of the substrate. The system and method are also operable to increase and decrease the extent of surface tension produced across the substrate surface through various adjusting processes, including varying the duration that the hydrophobic surface is exposed to the ion cloud; varying the power applied to the ion source that generates the ion cloud; and varying the distance between the ion cloud and the hydrophobic surface.

In another aspect, the substrate is coated with an anti-fouling coating or an oleophobic coating.

In another aspect, the power source is an alternating current.

In another aspect, the ion source generates a cloud, beam, or stream of ions.

In another aspect, the modification effect on the substrate surface increases proportionally with respect to increasing the amount of time the coating is exposed to the ion source, increasing power applied to the ion source, and decreasing the distance between the coating and the ion source.

In another aspect, the substrate is rotated while being immersed in the ion cloud.

One objective of the present invention is to create a modified surface effect on a hydrophobic-coated substrate so that commonly used adhesives can adhere to the substrate, and so the substrate can be manipulated in any number of manufacturing processes.

Another objective is to increase the surface tension on a substrate.

Yet another objective is to coat a substrate, so as to improve performance, i.e., lifetime, abrasion wear resistance, and other durability properties.

Yet another objective is to provide a system that allows the tension on the substrate to be modified by increasing the duration that the cloud engages the substrate, increasing the power from the power source, and decreasing the distance between the cloud and the hydrophobic-coated surface.

Another objective is to regulate the amount of smoothness on the substrate surface by increasing proportionally with respect to increasing the amount of time the coating is exposed to the ion source, increasing power applied to the ion source, and decreasing the distance between the coating and the ion source.

Yet another objective is to provide an inexpensive, low capital method for modifying the surface tension of a substrate.

Other systems, devices, methods, features, and advantages will be or become apparent to one with skill in the art upon examination of the following drawings and detailed description. It is intended that all such additional systems, methods, features, and advantages be included within this description, be within the scope of the present disclosure, and be protected by the accompanying claims and drawings.

BRIEF DESCRIPTION OF THE DRAWINGS

The invention will now be described, by way of example, with reference to the accompanying drawings, in which.

Like reference numerals refer to like parts throughout the various views of the drawings.

DETAILED DESCRIPTION OF THE INVENTION

Figure 1:
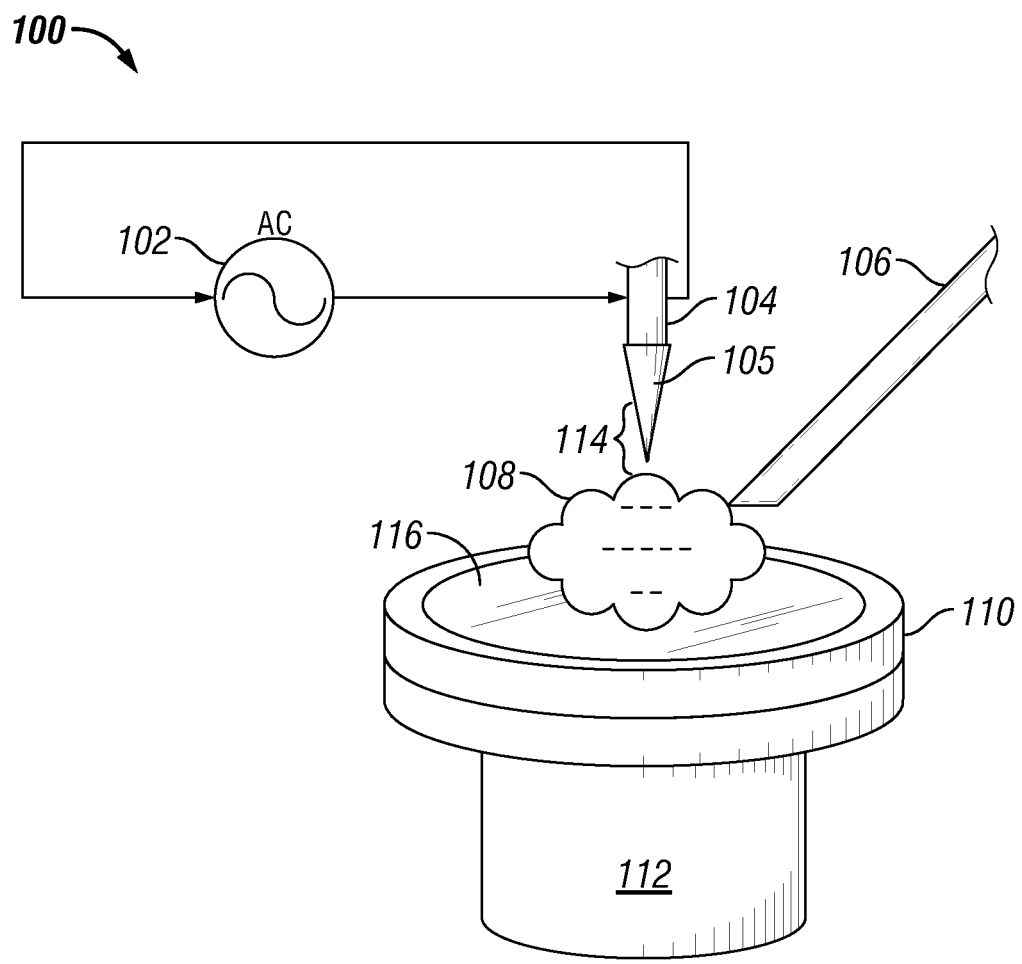
FIG. 1 illustrates a perspective view of an exemplary system to modify surface tension across a hydrophobic, anti-fouling, and oleophobic coated substrate, in accordance with an embodiment of the present invention.

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper," "lower," "left," "rear," "right," "front," "vertical," "horizontal," and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Specific dimensions and other physical characteristics relating to the embodiments disclosed herein are therefore not to be considered as limiting, unless the claims expressly state otherwise.

A system 100 and method 300 to modify surface tension across a hydrophobic, anti-fouling, and oleophobic coated substrate is referenced in FIGS. 1-11. The system 100 to modify surface tension across a hydrophobic, anti-fouling, and oleophobic coated substrate surface, hereafter "system 100" is configured to modify the surface tension, or smoothness, across a hydrophobic surface (or a superhydrophobic surface) of a substrate. The system 100 is also operable when the surface is coated with a hydrophobic, anti-fouling, and oleophobic coating. The system 100 works by immersing the substrate 110 in a dense cloud of ions. The extent of the modification produced across the substrate surface can be regulated to increase and decrease by varying the density of the ion cloud, varying the distance between the hydrophobic surface and the ion cloud, and varying the intensity of the ion cloud during immersion of the substrate. Such surface tension means can be efficacious for improving performance, i.e., lifetime, abrasion wear resistance, and other durability properties of a substrate, such as a lens. Any substrate having generally hydrophobic surface properties may, however, be enhanced through the system 100.

In one possible embodiment, the system 100 provides a simple set-up consisting of substantially: 1) an ion source 104 for generating an ion cloud in proximity to the substrate surface; 2) an inert gas carrier device 106 that delivers a carrier gas for increasing the density of the ion cloud; and 3) a rotating mount 112 for orienting and supporting the substrate while being immersed in the ion cloud 108. The ion cloud 108 is configured and positioned to interact with the hydrophobic-coated surface to modify the surface tension. This is possible because ion bombardment interacts with current surface tension of a substrate 110; thereby modifying the hydrophobic surface, even when coated with hydrophobic, superhydrophobic, anti-fouling, and oleophobic coatings.

In one embodiment, the system is operable on a substrate 110. The substrate may include a flat, convex, or concave lens, as shown in FIG. 1. In other embodiments, different substrates may also be used. In some possible embodiments, the substrate has a hydrophobic surface. In other embodiments, the substrate surface is coated with a hydrophobic coating, a superhydrophobic coating, an anti-fouling coating, and/or an oleophobic coating 116. The coating 116 may be applied in ultra-dry surface applications known in the art. Those skilled in the art will recognize that such a coating 116 can cause an imperceptibly thin layer of air to form on top of the surface of the substrate 110.

The ion source 104 (ion generator) generates a dense cloud of ions (cloud of atomic and molecular ions) that immerses the surface of the substrate. In one embodiment, a tube 200 carries the ions from the ion source 104 to the substrate 110. An ion outlet 202 in communication with the tube 200 discharges the ions. The ion cloud 108 is efficacious for modifying the surface, i.e., increasing friction, across the hydrophobic substrate surfaces (or superhydrophobic surfaces). This can be useful because hydrophobic surfaces may have a tendency to be slick, and not efficient for managing and controlling during manufacturing processes. In one possible embodiment, the coating 116 is applied prior to the immersion in the ion cloud 108.

The method is efficacious for modifying the surfaces across both hydrophobic and superhydrophobic surfaces. Those skilled in the art will recognize that the superhydrophobic surface is slicker than the standard hydrophobic surface. The superhydrophobic surface is a nanoscopic surface layer that repels water. For example, droplets hitting this kind of coating can fully rebound in the shape of a column. In one definition of superhydrophobic surface, as used in this invention, the superhydrophobic surface has a water contact angle of greater than 150° and a sliding angle of less than 10°.

Figure 2:
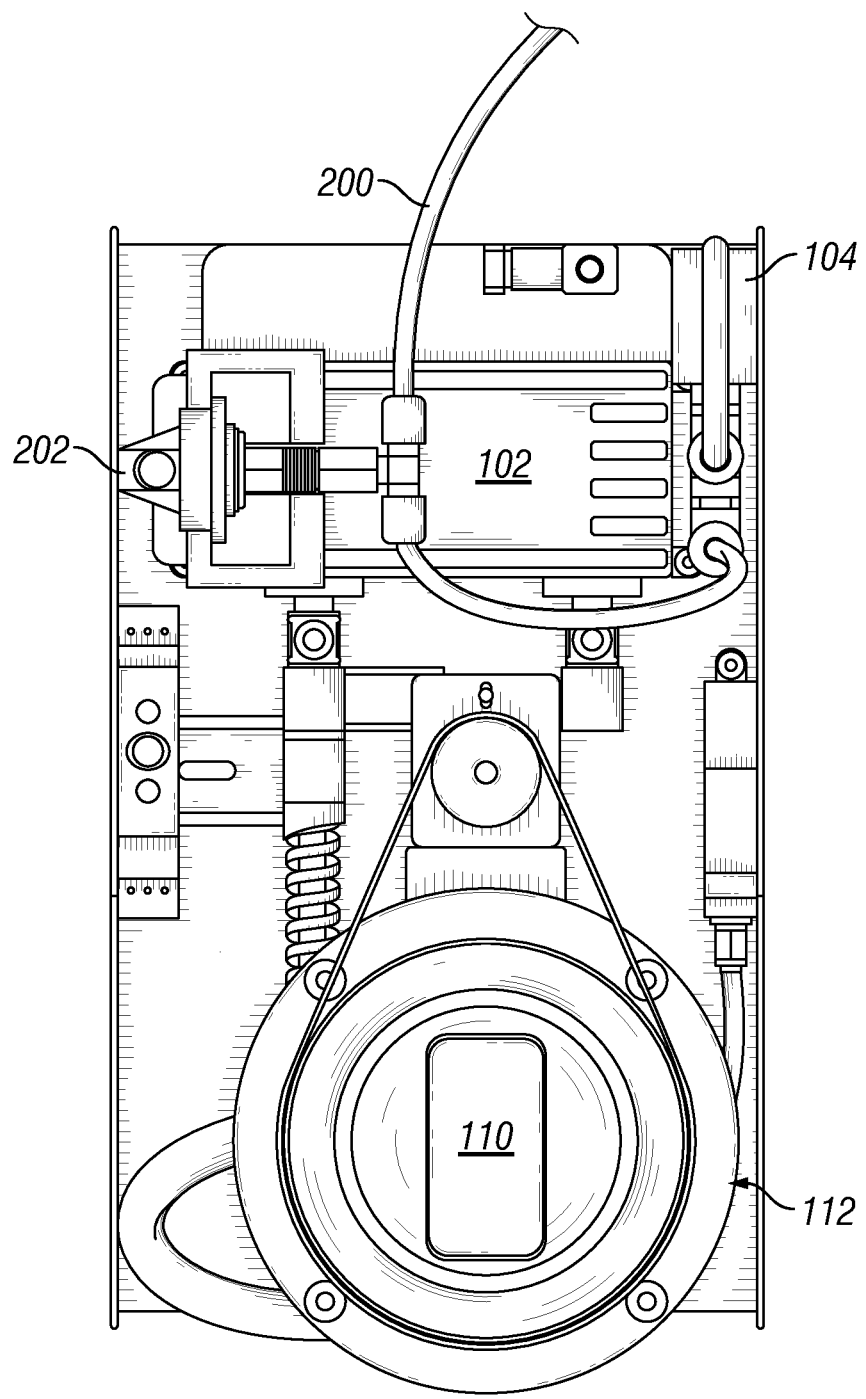
FIG. 2 illustrates a perspective view of the system, showing the ion source and power source positioned over the substrate, in accordance with an embodiment of the present invention.
Figure 3:
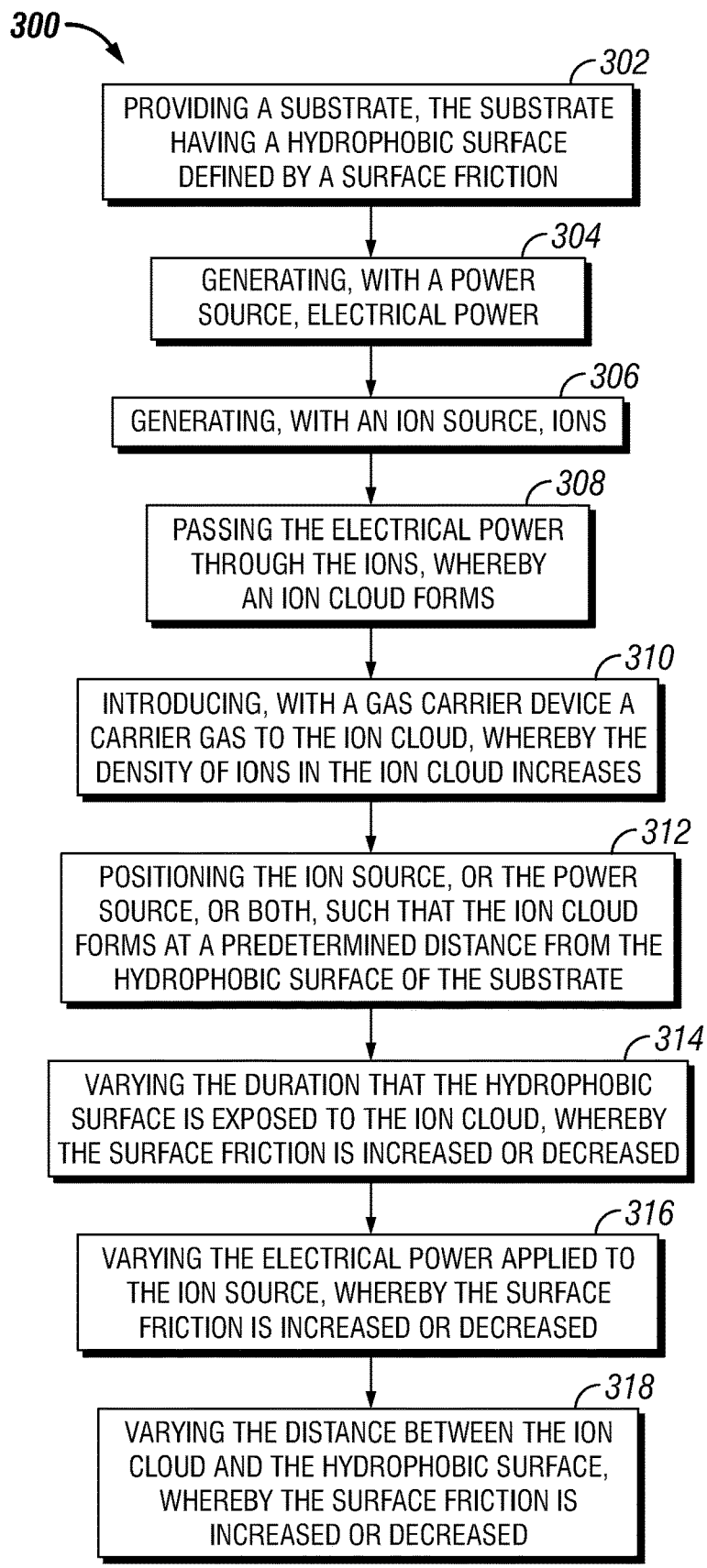
FIG. 3 illustrates a flowchart of an exemplary method to modify surface tension across a hydrophobic, anti-fouling, and oleophobic coated substrate, in accordance with an embodiment of the present invention.
Figure 4:
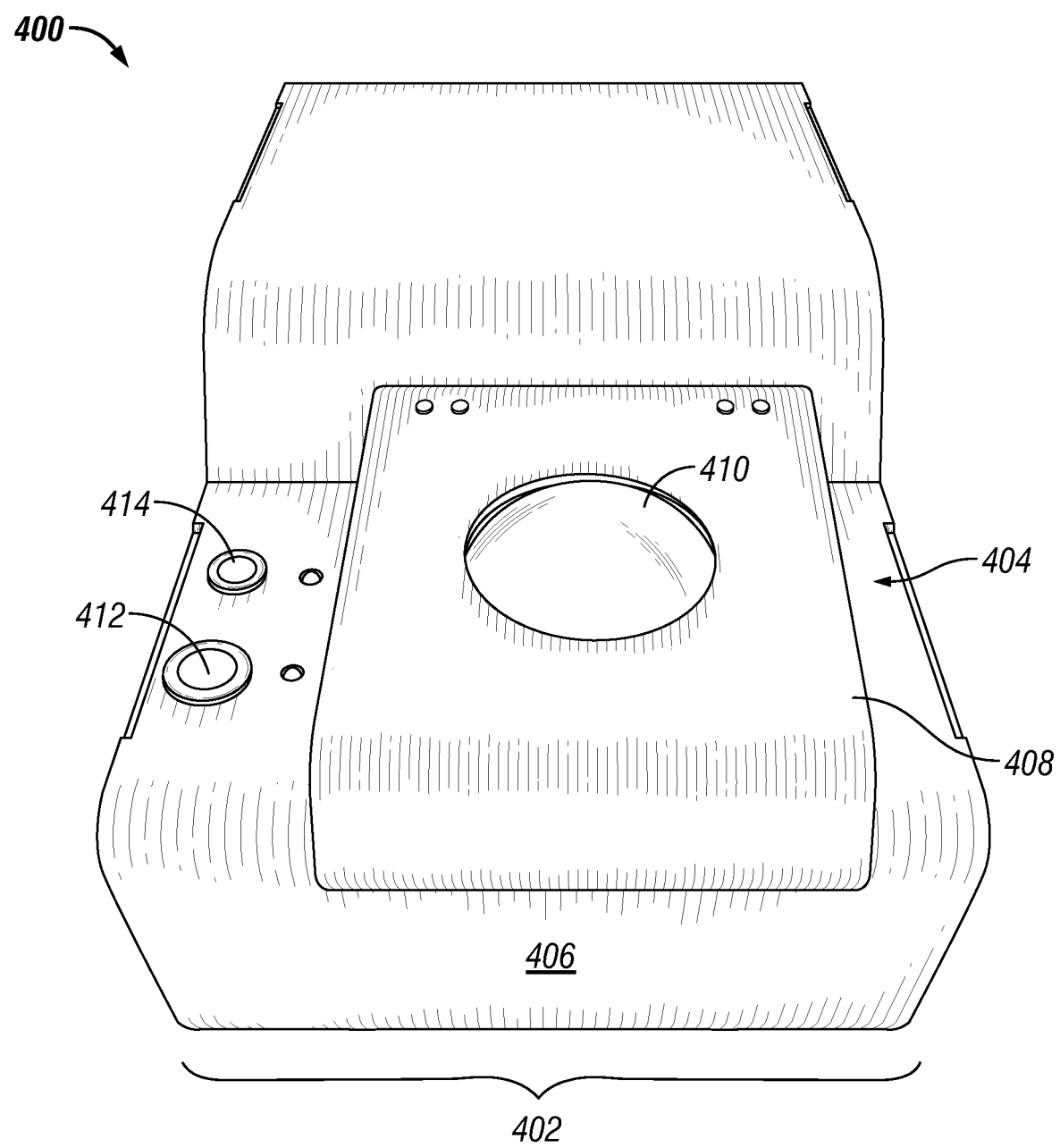
FIG. 4 illustrates a front perspective view of an exemplary substrate modification apparatus, in accordance with an embodiment of the present invention.
Figure 6:
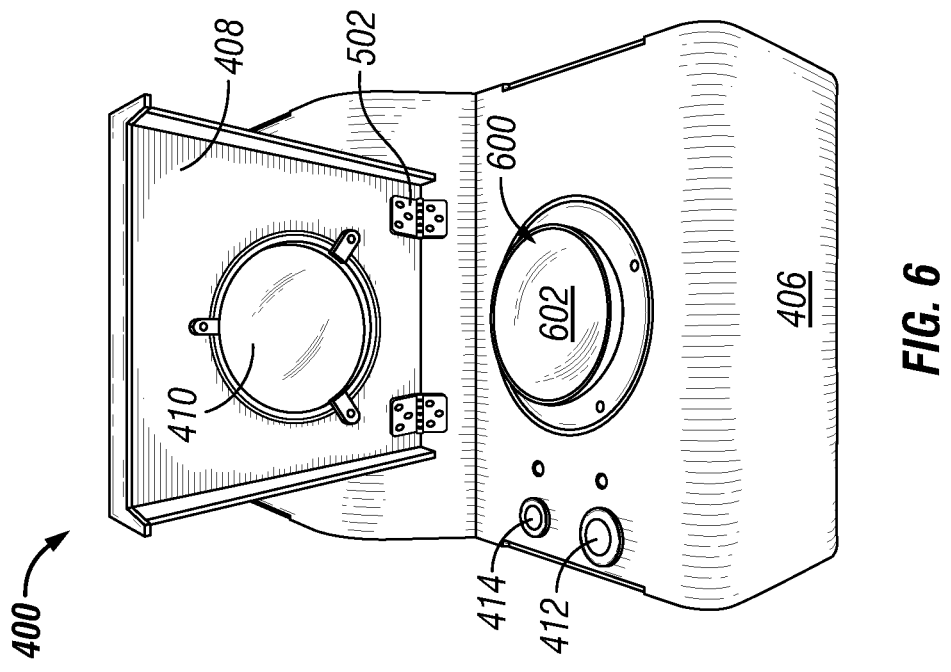
FIG. 6 illustrates a front perspective view of the substrate modification apparatus, showing the lid in an open position, and an exemplary substrate on the rotatable substrate holder, in accordance with an embodiment of the present invention.
Figure 5:
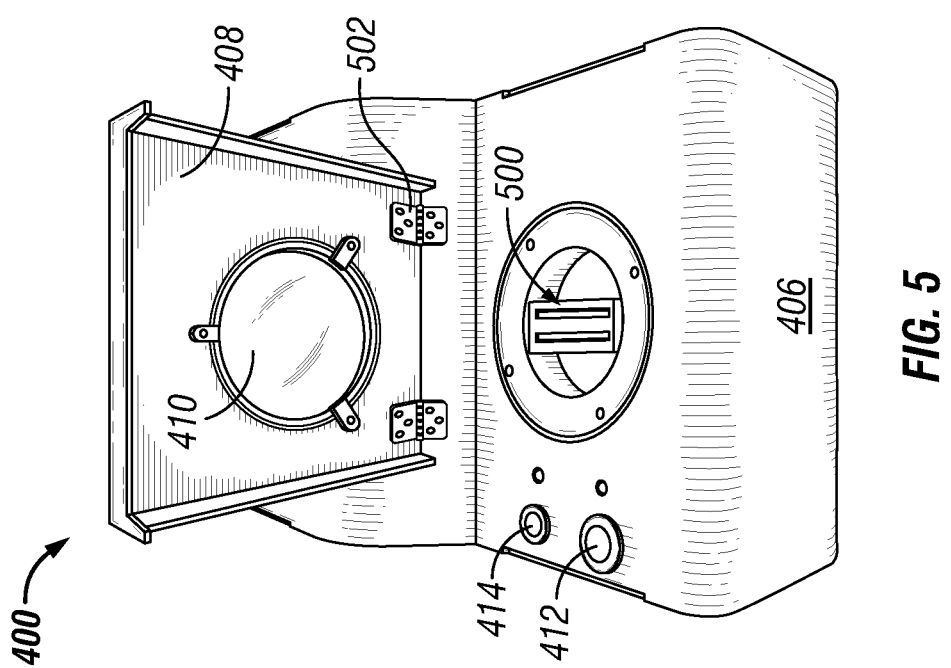
FIG. 5 illustrates a front perspective view of the substrate modification apparatus, showing the lid in an open position to enable access to a rotatable substrate holder, in accordance with an embodiment of the present invention.

Turning now to FIG. 2, the system 100 utilizes a high voltage power source 102 to generate electrical power. The electrical power may include a voltage or a current. The electrical power discharged from the one or more electrodes 105 is used to pass through, and thereby increase the ion density of the ion cloud 108. In some embodiments, the power source 102 that generates the electrical power discharged from the one or more electrodes 105 may include an alternating current (A/C). In one non-limiting embodiment, the electrical power is greater than 2 kilovolts. Though the system 100 is scalable, such that in some embodiments, a lesser or greater voltage may be used. In some embodiments, the power source 102 may include a battery that changes magnetic flux, and is linked with a conducting coil and discharged from the one or more electrodes 105. Though other power sources known in the art may also be used.

The system 100 provides an ion source 104 to generate the aforementioned cloud of atomic and molecular ions. The ion source 104 is operatively connected to the power source 102. Because the power source 102 and the ion source 104 are operatively connected, an ion cloud 108 forms as the electricity generated by the power source 102 charges the ions created in the ion source 104 and discharged from the one or more electrodes 105. In one non-limiting embodiment, the cloud is an ion cloud 108. Though in other embodiments, the generated cloud 108 may include an ion stream or an ion beam may be generated by the ion source 104. In some embodiments, the ions may include molecular ions known in the art. In some embodiments, the ion source 104 may include, without limitation, an electrospray ionization, electron impact ionization (EI), and MALDI. The electrical power generated discharges from the one or more electrodes 105 by the power source 102 passes through the generated ions.

The system 100 is unique in that the extent of the modified tension produced across the surface of the substrate is variable, based on the desired surface tension thereon. The means for varying the surface tension on the surface may include varying the distance between the ion source and the surface. This, in essence, moves the ion cloud 108 closer and further from the substrate. In one embodiment, the ion cloud 108 is generated at a predetermined distance 114 from the substrate 110. As FIG. 2 illustrates, the predetermined distance 114 may be less than 12". The predetermined distance 114 may, however, be increased or decreased as required. Thus, because the system 100 is scalable, other distances greater or lesser may also be used.

In addition to the proximal and distal position of the ion source relative to the substrate 110; the substrate 110 is rotated on a rotating mount 112 while being immersed in the ion cloud 108. The rate of rotation may affect the extent of smoothness/surface tension produced on the surface of the substrate 110. The rotating mount 112 may include an electrically powered mount that is in communication with the ion source, such that the ion source generates ion cloud in proportion to the rate of rotation.

Further, the system 100 is unique in that the surface tension on the substrate is substantially modified through use of a gas carrier device 106 that introduces an inert carrier gas to the ion cloud 108. The inert carrier gas serves to increase the density of the ions, which in turn modifies the surface tension on the hydrophobic-coated substrate 110. The inert carrier gas may include those known in the art, including, a noble gas, helium, argon, neon, xenon, krypton, and radon. The inert gas may be discharged directly into the ion cloud. Or in other embodiments, the carrier gas is introduced in a more gradual manner.

The system 100 is also unique in that the surface tension can be increased and decreased. The duration that the hydrophobic-coated surface of the substrate is exposed to the ion cloud 108 can vary the surface tension. In one example of modifying the surface tension, the surface tension of the substrate 110 changes by increasing the amount of time that the surface is exposed to the ion cloud 108.

In another possible means for varying the extent of tension applied to the substrate surface, the amount of power applied to the ion source 104 can be manipulated. This can be performed by manually or presetting the alternating current or voltage of the power source 102. In one example of modifying the surface tension, the surface tension of the substrate 110 changes by increasing the amount of electrical power generated by the power source 102.

Additionally, the extent of smoothness/tension applied to the substrate surface is possible by varying the distance between the ion cloud 108 and the hydrophobic-coated surface. In one example of increasing the surface tension, the surface tension of the substrate 110 increases by decreasing the distance between the ion cloud 108 and the hydrophobic-coated surface. This is possible by raising the rotatable mount on which the substrates rests, or by lowering the ion source 104 or power source 102 to a more proximal position to the substrate 110.

In accordance with the system 100 described above, FIG. 3 illustrates a flowchart of an exemplary method 300 to modify surface tension across a hydrophobic-coated substrate. The method 300 may include an initial Step 302 of providing a substrate, the substrate having a hydrophobic surface defined by a surface tension. The rate of rotation may also affect the extent of smoothness on the surface of the substrate 110. The rotating mount 112 may include an electrically powered mount that is in communication with the ion source, such that the ion source generates ion cloud in proportion to the rate of rotation. The method 300 may further comprise a Step 304 of generating, with a power source, electrical power. In one non-limiting embodiment, the electrical power is at least 2 kilovolts. A Step 306 includes generating ions with an ion source 104. The ions may include molecular ions known in the art.

In some embodiments, a Step 308 comprises passing the electrical power through the ions, whereby an ion cloud forms at atmosphere. A Step 310 may include introducing, with a gas carrier device a carrier gas to the ion cloud, whereby the density of ions in the ion cloud increases. An additional Step may include rotating the substrate on a rotating mount while being immersed in the ion cloud. A Step 312 includes positioning the ion cloud at a predetermined distance from the hydrophobic surface of the substrate, whereby the hydrophobic surface immerses in the ion cloud, whereby the surface tension of the hydrophobic surface is modified.

In some embodiments, a Step 314 may include varying the duration that the hydrophobic surface is exposed to the ion cloud, whereby the surface tension of the hydrophobic surface is increased or decreased. A Step 316 comprises varying the electrical power applied to the ion source, whereby the surface tension of the hydrophobic surface is increased or decreased. The method 300 may further comprise a Step 318 of varying the duration that the hydrophobic-coated surface is exposed to the ion cloud 108, whereby the surface tension is increased or decreased. A Step 320 includes varying the distance between the ion cloud and the hydrophobic surface, whereby the surface tension of the hydrophobic surface is increased or decreased.

In sum, the system 100 and method 300 work to modify surface tension across a hydrophobic-coated substrate having a hydrophobic surface defined by a surface tension works to modify the surface tension, or smoothness, across the hydrophobic surface of substrate. The modification in surface tension is accomplished by generating power through an ion source to create an ion cloud. The ion cloud is generated at a predetermined distance from the substrate. The ions interact with the hydrophobic surface to create a change in surface tension. A gas carrier device introduces an inert carrier gas through the ion cloud to increase the density of the ions, which in turn modifies the surface tension. The system is variable, selectively increasing and decreasing the surface tension by: varying the duration that the hydrophobic surface is exposed to the ion cloud; varying power applied to the ion source; and varying the distance between the ion cloud and the hydrophobic surface.

Turning now to FIG. 4, the system 100 includes a substrate modification apparatus 400. The substrate 600 modification apparatus 400, hereafter "apparatus 400" is configured to modify the surface tension across the hydrophobic surface 602 of a substrate 600. In operation, the substrate 600 is immersed in a dense ion cloud that creates chemical reactions directly on the hydrophobic surface 602. This serves to modify the hydrophobic surface 602 by increasing the surface tension, or smoothness, thereof. Conversely, the surface tension could also be modified by decreasing the surface tension. The intensity of the modification is controllable through various manipulations of the ion cloud in which the substrate 600 is immersed.

In one possible embodiment, the surface tension of the hydrophobic surface 602 is increased, or decreased, by varying the amount of voltage applied to ions that make up the ion cloud. In another embodiment, the surface tension of the hydrophobic surface 602 is increased or decreased by varying the distance between ion cloud and the electrodes 700 that generate the voltage. In yet another embodiment, the surface tension of the hydrophobic surface 602 is modified by increasing the density of the ion cloud, through use of an inert gas. In yet another embodiment, the surface tension of the hydrophobic surface 602 is increased or decreased by varying the duration that the substrate 600 is immersed in the ion cloud. In yet another embodiment, the surface tension of the hydrophobic surface 602 is modified by varying the rotational speed of the substrate 600 while immersed in the ion cloud. This unique modification of the hydrophobic surface 602 may be performed at atmosphere, i.e., approximately 1.01325 bar.

As shown in FIG. 5, the apparatus 400 provides a housing 402 that forms the protective encasing of the components of apparatus 400. The housing 402 may include multiple sidewalls 406 having openings to accommodate various switches, ports, and circuitry inside an interior cavity. In other possible embodiments, the housing 402 has a cubicle or rectangular shape. Suitable materials for the housing 402 may include, without limitation, aluminum, steel, metal alloys, and a rigid polymer. In some embodiments, the housing 402 comprises a substrate chamber 404 that is sized and dimensioned to contain a rotatable substrate holder 500, described below.

The rotatable substrate holder 500 has a platform or space that is sized and dimensioned to retain the substrate 600 in a horizontal position, such that the hydrophobic surface 602 is fully exposed to be modified by the ion cloud. FIG. 6 shows the substrate 600 placed inside the substrate chamber 404. The substrate chamber 404 is accessed through a lid 408 with a transparent panel 410. The lid 408 may hingedly or slidably move between open and closed positions to enable access to the substrate chamber 404; and thereby the substrate 600 thereon.

The apparatus 400 provides a rotatable substrate holder 500 disposed inside the substrate chamber 404 of the housing 402. The rotatable substrate holder 500 is configured to rotate while supporting a substrate 600. In other embodiments, the rotatable substrate holder 500 can oscillate while rotating to create a different effect and to expose the substrate 600 to optimal amount of the ion cloud. As referenced in FIG. 7, the apparatus 400 includes a rotating mount 706 that attaches to the rotatable substrate holder 500. The rotating mount 706 can be rotated by electrical power or a small motor, for example, so as to rotate the rotatable substrate holder 500 resting thereupon. In operation, the rotating mount may rotate up to 360°; thereby rotating the substrate 600 positioned atop the rotatable substrate holder 500.

As discussed above, the apparatus 400 is effective in modifying the surface tension across the hydrophobic surface 602 of a substrate 600. The substrate 600 may include a flat, convex, or concave lens, as shown in FIG. 6. In other embodiments, different substrates may also be used. In some embodiments, the substrate 600 defines a hydrophobic surface 602 having a surface tension. In other embodiments, the substrate 600 has a superhydrophobic surface 602. In some embodiments, a coating at least partially covers the hydrophobic surface 602 of the substrate 600. In other embodiments, the coating comprises an anti-fouling coating or an oleophobic coating.

In alternative embodiments, the substrate surface is coated with a hydrophobic coating, a superhydrophobic coating, an anti-fouling coating, and/or an oleophobic coating. The coating may be applied in ultra-dry surface applications known in the art. Those skilled in the art will recognize that such a coating can cause an imperceptibly thin layer of air to form on top of the surface of the substrate 600.

The apparatus 400 also comprises one or more electrodes 700, which are operable in the interior cavity of the housing 402 to conduct electricity, i.e., form the voltage. In some embodiments, the electrodes 700 conduct electricity, and thereby enable generation of a voltage between two or more electrodes 700. The electrodes 700 are disposed in proximity to the rotatable substrate holder 500. For example, being arranged vertically on each side of the rotatable substrate holder 500. The electrodes 700, however, can also be integrated into the rotatable substrate holder 500, while serving the purpose of carrying the voltage thereacross. In some embodiments, the electrodes 700 can be fabricated from metal, which are formed as two terminals of an electrically conducting medium. In other embodiments, the one or more electrodes 700 are electromagnetic coils, which enable the production of varying magnetic flux when a voltage is applied thereto.

Figure 8:
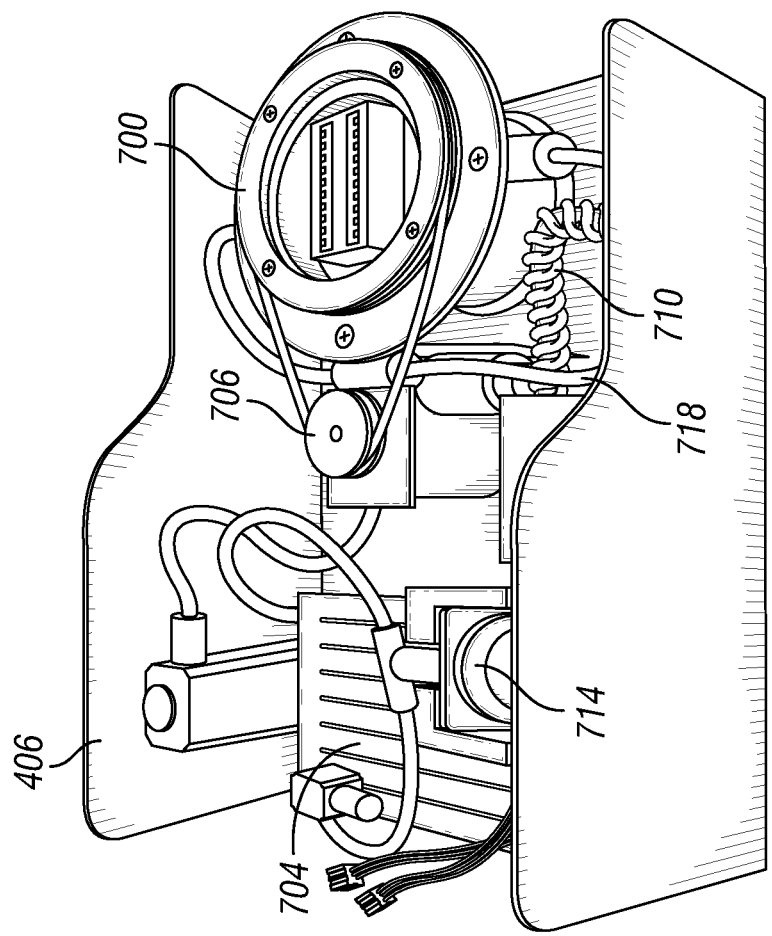
FIG. 8 illustrates an upper perspective view of the substrate modification apparatus, showing the electrical components, including an ion source and a power source, in accordance with an embodiment of the present invention.

As referenced in FIG. 8, the apparatus 400 also includes a power source 702. In one non-limiting embodiment, the power source 702 is a battery and/or a coil. In other embodiments, the power source 702 can be an A/C source. The power source 702 is configured to provide the electricity necessary to generate a voltage across the electrodes 700. For this reason, the power source 702 may be operatively and mechanically connected to the electrodes 700. The voltage that is generated from the power source 702 can be variable, adjusted by a voltage controlling means known in the art. In alternative embodiments, the voltage is beyond 2 kilovolts. Significantly, when the voltage is applied to ions, an ion cloud forms, as discussed below. Further, by increasing the voltage, the density of the ion cloud can be increased. The characteristics of the ion cloud are thus adjustable, and determinative of the modification of the surface tension across the hydrophobic surface 602 of the substrate 600.

Figure 9:
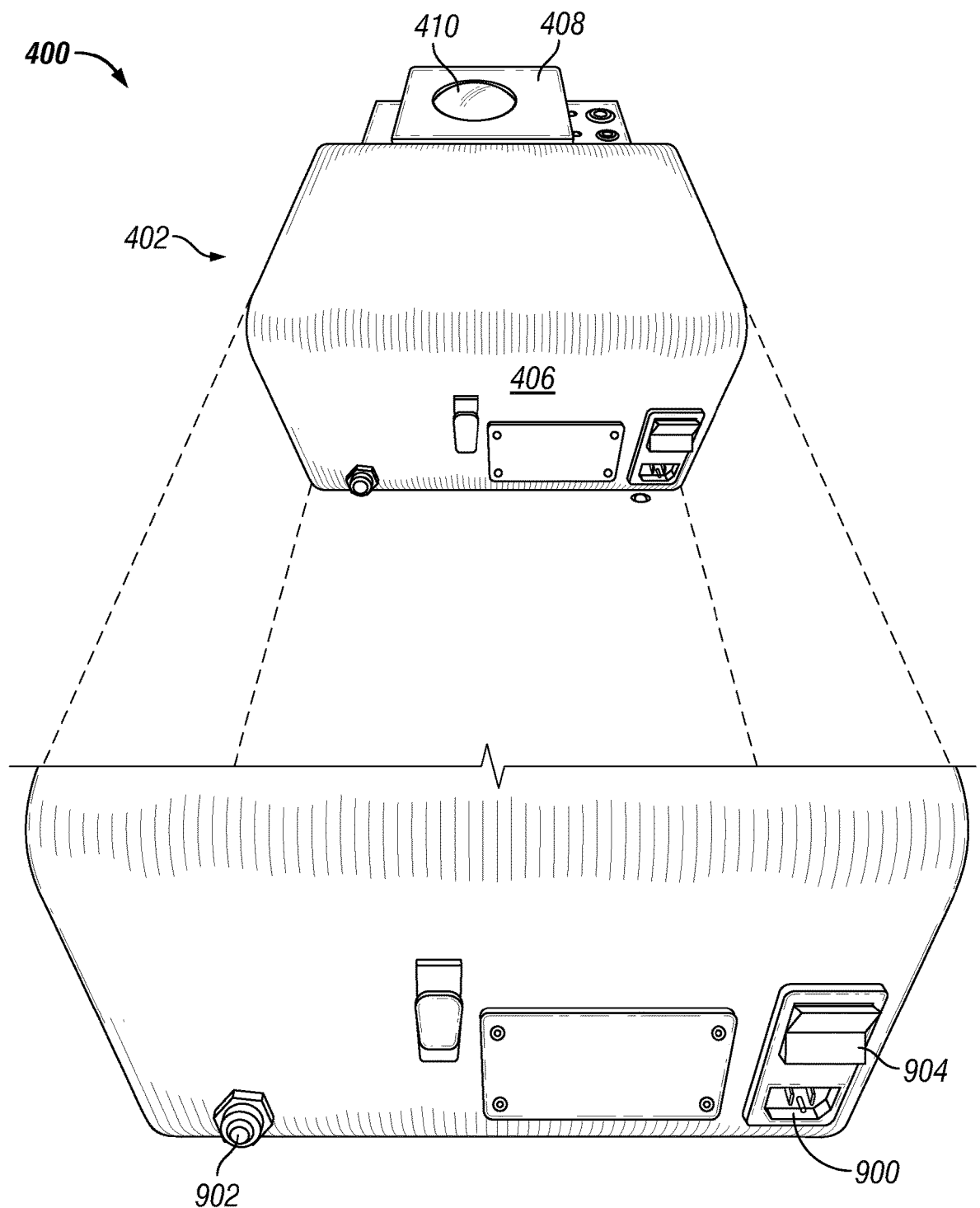
FIG. 9 illustrates a top view of the substrate modification apparatus, showing the rear sidewall having power input and gas inlet ports, in accordance with an embodiment of the present invention.

Looking now at the housing 402 in FIG. 9, the apparatus 400 provides a power input 900 that is operatively connected to the power source 702. The power input 900 can feed or recharge the power source 702 through an input port in the housing 402. The power input 900 may be accessible from the outer surface of the housing 402, and include a power port, or an electrical plug. In some embodiments, the power input 900 provides an A/C power supply. A rear power switch 904 can be used to close the circuit for transmitting electricity from the power input 900. In other embodiments, the apparatus 400 includes a timing circuit 708 that is operatively connected to the power source 702. The timing circuit 708 regulates electrical output of the power source 702 and/or flowage of an inert gas, described below. A power button 412 may be operatively connected to the power source 702 and other electrical components for powering on and off the apparatus 400.

In some embodiments, the apparatus 400 further provides a safety switch 502 that is operatively connected to the power source 702. The safety switch 502, which is operable directly on the housing 402, enables the power to be automatically shut off in an emergency, or if a power surge occurs. Thus, the safety switch 502 is operatively connected to the power input 900 and the power source 702. Other electrical components for generating and altering the voltage, as are known in the art, may also be used.

In one possible embodiment, the apparatus 400 provides an ion source 704 that is operable to generate ions. The ion source 704 is configured to generate the aforementioned ion cloud, which is comprised of atomic and molecular ions. The ion source 704 is operatively connected to the power source 702. Because the power source 702 and the ion source 704 are connected, an ion cloud forms as the voltage generated by the power source 702 charges the ions. It is known in the art that voltage causes the ions to form an ion cloud. As the ions are excited by the electricity, the atoms expand and create such a cloud. In one non-limiting embodiment, the ion cloud is an ion stream or an ion beam. In other embodiments, the ions may include molecular ions. In some embodiments, the ion source 704 may include, without limitation, an electrospray ionization, electron impact ionization (EI), and MALDI.

Figure 7:
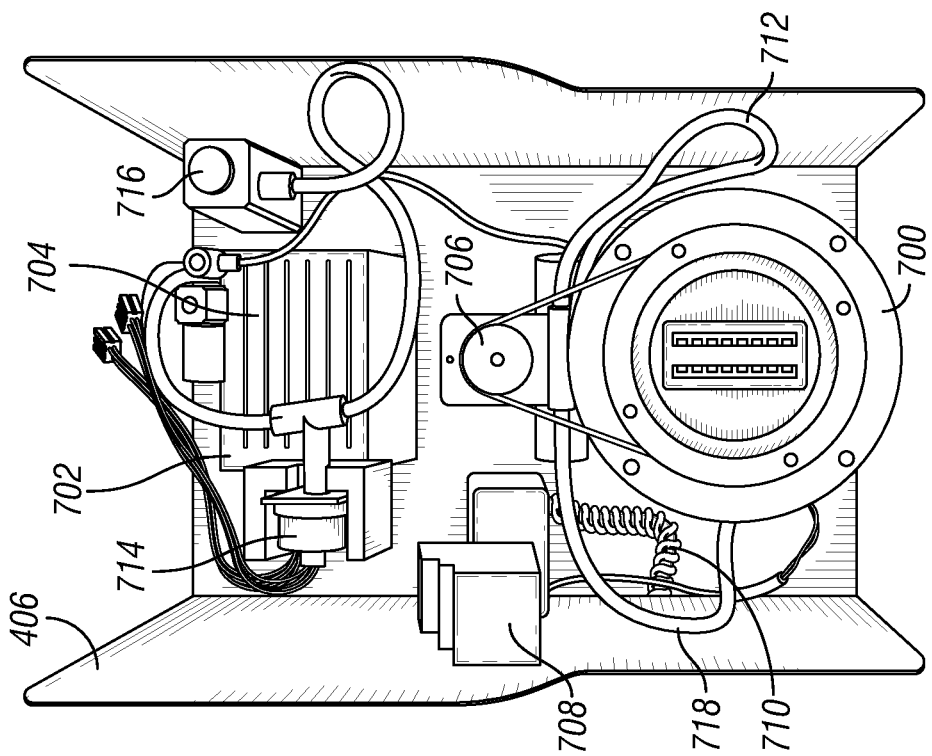
FIG. 7 illustrates a top view of the substrate modification apparatus, showing the electrical components, including an ion source and a power source, in accordance with an embodiment of the present invention.

In some embodiments, an ion line 710 carries the ions from the ion source 704, towards the electrodes 700, or in proximity to the electrodes 700. This may involve discharge of the ions across the upper face of the rotatable substrate holder 500, which supports the substrate 600. In this manner, the hydrophobic surface 602 is optimally exposed to the ion cloud. As shown in FIG. 7, the ion line 710 carries the ions from the ion source 704 to an ion head at the rotatable substrate holder 500. The ion head is configured to discharge the ions towards the one or more electrodes 700. The ion line 710 can include a plastic or copper tube.

In some embodiments, the apparatus 400 also provides an ion outlet line 712 that is in fluid communication with the rotatable substrate holder 500. The ion outlet line 712 enables discharge of the ion cloud away from the rotatable substrate holder 500. In other embodiments, the ion outlet line carries the ion cloud, or ions, back to the gas chamber 1000 for reuse. The ion outlet line 712 can include a plastic or copper tube. Various ion movement means known in the art may be used to urge the ion cloud/ions from the area of the rotatable substrate holder 500, and into the ion outlet line.

Figure 10:
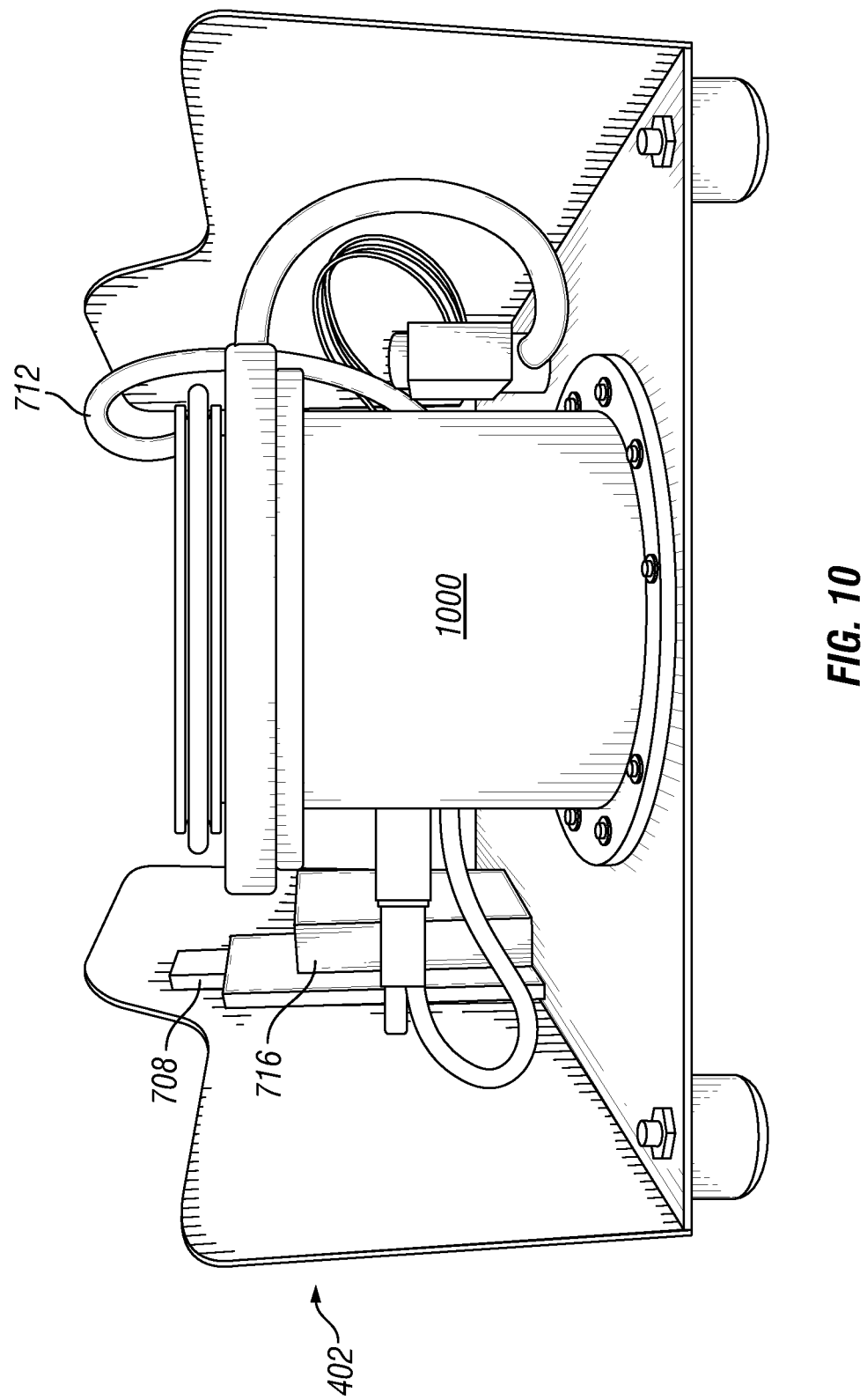
FIG. 10 illustrates a side view of the substrate modification apparatus, with the rear sidewall removed, showing the gas chamber, in accordance with an embodiment of the present invention.

Turning now to FIG. 10, the apparatus 400 also provides a gas chamber 1000. The gas chamber 1000 is sized and dimensioned to contain an inert gas, such as an inert carrier gas known in the art of gas technology and lens surface modification technologies. The inert gases used may include, without limitation, helium (He), neon (Ne), argon (Ar), krypton (Kr), xenon (Xe), and radon (Rn). The inert gas is unique in the chemical reaction with the ion cloud—namely, causing the ion cloud to become denser.

Those skilled in the art will recognize that the inert gases have large ionization energies, reflecting their chemical inertness. It is also significant to note that the heavier inert gases have more electron shells than the lighter ones. Hence, the outermost electrons are subject to a shielding effect from the inner electrons that makes them more easily ionized, because they are less strongly attracted to the positively charged nucleus. This ionization of the inert gas, when introduced into an ion cloud, creates a denser ion cloud. And as discussed below, a denser ion cloud is efficacious for modifying the hydrophobic surface 602 of the substrate 600.

The apparatus 400 may also comprise a gas inlet 902 that is in fluid communication with the gas chamber 1000. The gas inlet 902 couples to tubing that carries the inert gas from the gas chamber 1000 to the rotatable substrate holder 500 for introduction into the ion cloud. In other embodiments, the apparatus 400 also includes a gas pressure sensor 714 that is operatively connected to the gas chamber 1000. In other embodiments, the apparatus 400 may also include a gas flow regulator 716 that is operatively connected to the gas line. The gas flow regulator 716 is configured to regulate the flow of the inert carrier gas through the gas line. The gas flow regulator 716 may be a valve that is operatively connected to the timing circuit 708 or gas pressure sensor, for example. A low gas indicator 414 may also illuminate from the housing 402 when the inert gas in the gas chamber 1000 is below a predetermined threshold.

In some embodiments, the apparatus 400 provides a gas line 718 that carries the inert gas from the gas chamber 1000 to proximity of the electrodes 700. Significantly, the inert gas helps to increase the density of the ion cloud. The denser ion cloud is thereby made more efficacious in modifying the surface tension across the hydrophobic surface 602 of the substrate 600. In this manner, the substrate 600—including the hydrophobic surface 602—fully immerses in the increased density ion cloud.

The apparatus 400 described above is configured to achieve variable functionalities that enables selective modification of the surface tension of the hydrophobic surface 602s for substrates. For example, in one possible embodiment, the power source 702, or a voltage controller connected thereto, can vary the amount of voltage across the electrodes 700. This serves to increase or decrease the surface tension of the hydrophobic surface 602. Thus, by increasing the voltage through the power source 702, the power input 900, or the voltage controller, the ion cloud is denser and thereby creates a smoother hydrophobic surface 602 on the substrate 600.

Another varying embodiment is that varying the duration that the substrate 600 is exposed to the ion cloud increases or decreases the surface tension of the hydrophobic surface 602. The longer the substrate 600 is allowed to rotate on the rotatable substrate holder 500, the greater the modification thereof. Also, the rotational speed may be adjusted to vary the extent of modification across the hydrophobic surface 602. In yet another varying embodiment, the surface tension of the hydrophobic surface 602 is increased or decreased by varying the distance between ion cloud and the electrodes 700. This can include adjusting the position/orientation of the ion line 710 to discharge more or less directly towards the rotatable substrate holder 500. Thus, a direct, full throttle discharge of ions towards the electrodes 700 and rotatable substrate holder 500 may increase the smoothness of the hydrophobic surface 602.

Figure 11:
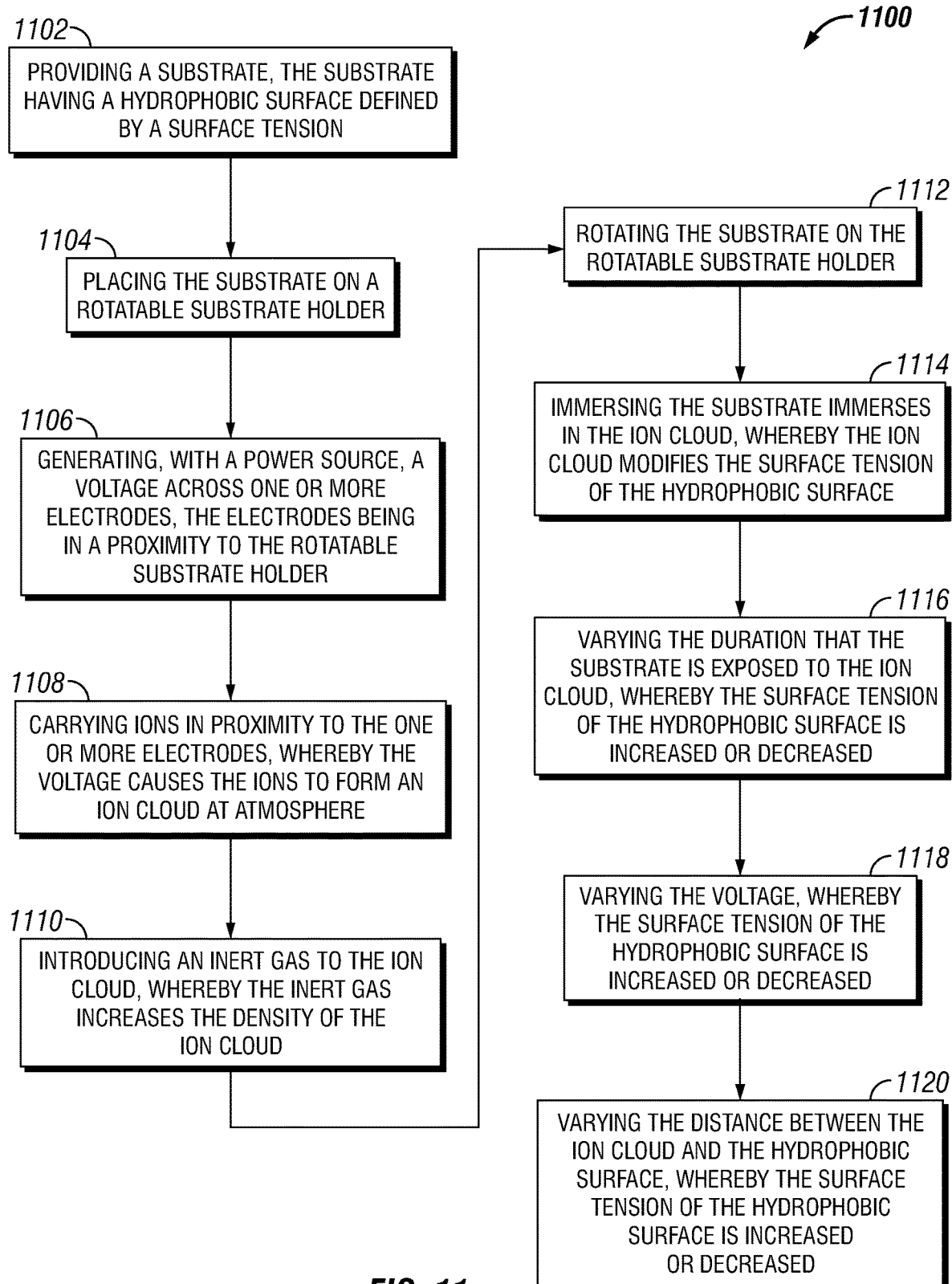
FIG. 11 illustrates a flowchart of an exemplary method to modify surface tension at atmosphere across a hydrophobic substrate with a substrate modification apparatus, in accordance with an embodiment of the present invention.

FIG. 11 references an exemplary method 1100 that works with the apparatus, to modify surface tension at atmosphere across a hydrophobic substrate. The method 1100 may include an initial Step 1102 of providing a substrate, the substrate having a hydrophobic surface defined by a surface tension. Another Step 1104 may include placing the substrate on a rotatable substrate holder. The substrate is placed in a horizontal orientation with the hydrophobic surface exposed. Yet another Step 1106 may include generating, with a power source, a voltage across one or more electrodes, the electrodes being in proximity to the rotatable substrate holder. The voltage can be variable, so as to adjust the modification of the surface tension.

In some embodiments, the method 1100 also includes a Step 1108 of carrying ions in proximity to the one or more electrodes, whereby the voltage causes the ions to form an ion cloud at atmosphere. The method 1100 also comprises introducing an inert gas to the ion cloud, whereby the inert gas increases the density of the ion cloud. The inert gas is configured to increase the density of the ion cloud. Another Step 1112 may include rotating the substrate on the rotatable substrate holder. Another Step 1114 may include immersing the substrate immerses in the ion cloud, whereby the ion cloud modifies the surface tension of the hydrophobic surface. Yet another Step 1116 may include varying the duration that the substrate is exposed to the ion cloud, whereby the surface tension of the hydrophobic surface is increased or decreased. In some embodiments, the method 1100 comprises a Step 1118 of varying the voltage, whereby the surface tension of the hydrophobic surface is increased or decreased. A final Step 1120 can include varying the distance between the ion cloud and the hydrophobic surface, whereby the surface tension of the hydrophobic surface is increased or decreased.

Although the process-flow diagrams show a specific order of executing the process steps, the order of executing the steps may be changed relative to the order shown in certain embodiments. Also, two or more blocks shown in succession may be executed concurrently or with partial concurrence in some embodiments. Certain steps may also be omitted from the process-flow diagrams for the sake of brevity. In some embodiments, some or all the process steps shown in the process-flow diagrams can be combined into a single process.

These and other advantages of the invention will be further understood and appreciated by those skilled in the art by reference to the following written specification, claims and appended drawings.

Because many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalence.

What is claimed is:

1. A substrate modification apparatus for modifying the surface tension across a hydrophobic substrate at atmosphere, the apparatus comprising:
a housing containing:
  a rotatable substrate holder operable to enable retention of a substrate, the substrate being defined by a hydrophobic surface having a surface tension;
  one or more electrodes disposed in proximity to the rotatable substrate holder;
  a power source operable to generate a voltage across the electrodes, the power source being operatively connected to the one or more electrodes;
  an ion source operable to generate ions;
  an ion line carrying the ions in proximity to the electrodes,
  whereby the voltage causes the ions to form an ion cloud;
  a gas chamber operable to enable containment of an inert gas; and
  a gas line carrying the inert gas from the gas chamber to proximity of the electrodes,
  whereby the inert gas helps to increase the density of the ion cloud, and the substrate immerses in the increased density ion cloud,
  whereby the surface tension of the hydrophobic surface is increased or decreased by varying the voltage,
  whereby the surface tension of the hydrophobic surface is increased or decreased by varying the distance between ion cloud and the electrodes,
  whereby the surface tension of the hydrophobic surface is increased or decreased by varying the duration that the substrate is immersed in the ion cloud.

2. The apparatus of claim 1, wherein the housing comprises a substrate chamber for containing the rotatable substrate holder, the housing further comprising a lid with a transparent panel for regulating access to the substrate chamber.

3. The apparatus of claim 1, wherein the power source comprises a battery and a coil.

4. The apparatus of claim 1, wherein the power source is operable to generate a variable voltage across the one or more electrodes.

5. The apparatus of claim 1, wherein increasing the voltage helps increase the density of the ion cloud.

6. The apparatus of claim 1, wherein the one or more electrodes comprises an electromagnetic coil.

7. The apparatus of claim 1, further comprising a rotating mount attached to the rotatable substrate holder, and operable to rotate the rotatable substrate holder.

8. The apparatus of claim 7, wherein the rotating mount is operable to rotate up to 360 degrees.

9. The apparatus of claim 1, wherein the ion source includes at least one of the following: an electrospray ionization, electron impact ionization, and a MALDI.

10. The apparatus of claim 1, wherein the ion line carries the ions from the ion source to an ion head at the rotatable substrate holder, the ion head configured to discharge the ions towards the one or more electrodes.

11. The apparatus of claim 1, further comprising an ion outlet line in fluid communication with the rotatable substrate holder, the ion outlet line being operable to discharge the ion cloud away from the rotatable substrate holder.

12. The apparatus of claim 1, further comprising a gas flow regulator operatively connected to the gas line, the gas flow regulator configured to regulate the flow of the inert carrier gas through the gas line.

13. The apparatus of claim 1, wherein the substrate has a superhydrophobic surface.

14. The apparatus of claim 1, wherein a coating at least partially covers the hydrophobic surface of the substrate, the coating comprising an anti-fouling coating or an oleophobic coating.

15. The apparatus of claim 1, further comprising a power input operatively connected to the power source.

16. The apparatus of claim 1, further comprising a gas inlet in fluid communication with the gas chamber.

17. The apparatus of claim 1, further comprising a gas pressure sensor operatively connected to the gas chamber.

18. The apparatus of claim 1, further comprising a timing circuit operatively connected to the power source.

19. The apparatus of claim 1, further comprising a safety switch operatively connected to the power source.

20. A method to modify surface tension at atmosphere across a hydrophobic substrate with a substrate modification apparatus, the method comprising:

providing a substrate, the substrate having a hydrophobic surface defined by a surface tension;

placing the substrate on a rotatable substrate holder;

generating, with a power source, a voltage across one or more electrodes, the electrodes being in proximity to the rotatable substrate holder;

carrying ions in proximity to the one or more electrodes, whereby the voltage causes the ions to form an ion cloud at atmosphere;

introducing an inert gas to the ion cloud, whereby the inert gas increases the density of the ion cloud;

rotating the substrate on the rotatable substrate holder;

immersing the substrate immerses in the ion cloud, whereby the ion cloud modifies the surface tension of the hydrophobic surface;

varying the duration that the substrate is exposed to the ion cloud, whereby the surface tension of the hydrophobic surface is increased or decreased;

varying the voltage, whereby the surface tension of the hydrophobic surface is increased or decreased; and varying the distance between the ion cloud and the hydrophobic surface, whereby the surface tension of the hydrophobic surface is increased or decreased.

* * * * *